(12) United States Patent
Weiner et al.

(10) Patent No.: US 8,772,772 B2
(45) Date of Patent: Jul. 8, 2014

(54) SYSTEM AND METHOD FOR INCREASING PRODUCTIVITY OF COMBINATORIAL SCREENING

(75) Inventors: Kurt H. Weiner, San Jose, CA (US); Tony P. Chiang, Campbell, CA (US); Gustavo A. Pinto, Belmont, CA (US)

(73) Assignee: Intermolecular, Inc., San Jose, CA (US)

( * ) Notice: Subject to any disclaimer, the term of this patent is extended or adjusted under 35 U.S.C. 154(b) by 1355 days.

(21) Appl. No.: 11/419,174

(22) Filed: May 18, 2006

(65) Prior Publication Data
US 2007/0267631 A1 Nov. 22, 2007

(51) Int. Cl.
*H01L 23/58* (2006.01)

(52) U.S. Cl.
USPC .................... 257/48; 257/E43.005

(58) Field of Classification Search
USPC ............................ 257/48, E43.005
See application file for complete search history.

(56) References Cited

U.S. PATENT DOCUMENTS

| | | | |
|---|---|---|---|
| 3,131,098 A | 4/1964 | Krsek et al. | |
| 3,985,635 A | 10/1976 | Adam et al. | |
| 4,743,954 A | 5/1988 | Brown | |
| 5,356,756 A | 10/1994 | Cavicchi et al. | |
| 5,603,351 A | 2/1997 | Cherukuri et al. | |
| 5,655,110 A | 8/1997 | Krivokapic et al. | |
| 5,985,356 A * | 11/1999 | Schultz et al. ............... | 427/8 |
| 6,004,617 A | 12/1999 | Schultz et al. | |
| 6,040,193 A | 3/2000 | Winkler et al. | |
| 6,045,671 A | 4/2000 | Wu et al. | |
| 6,063,633 A | 5/2000 | Wilson, III | |
| 6,079,873 A | 6/2000 | Cavicchi et al. | |
| 6,159,644 A | 12/2000 | Satoh et al. | |
| 6,187,164 B1 | 2/2001 | Warren et al. | |
| 6,287,977 B1 | 9/2001 | Hashim et al. | |
| 6,306,658 B1 | 10/2001 | Turner et al. | |

(Continued)

FOREIGN PATENT DOCUMENTS

| | | |
|---|---|---|
| DE | 1251283 | 10/1967 |
| WO | WO 00/48725 | 8/2000 |

(Continued)

OTHER PUBLICATIONS

Varian Semiconductor Equipment Associates, Inc., "Varian Semiconductor Introduces VIISta vMask(TM)," press release, Jun. 27, 2007, http://phx.corporate-ir.net/phoenix.zhtml?c=89189&p=irol-newsArticle_print&ID=869200.

(Continued)

*Primary Examiner* — Zandra Smith
*Assistant Examiner* — Jamie C Niesz

(57) ABSTRACT

The present invention provides systems and methods for simultaneous, parallel and/or rapid serial testing of material parameters or other parameters of the result of a process. The testing is typically used for screening different methods or materials to select those methods or materials with desired properties. A reactor structure used to form the materials may consist of an array of small isolated reaction chambers that overlie the substrate so that the substrate forms a bottom surface of each isolated reaction chamber. Test structures are formed on the substrate, where the location of each test structure corresponds to an isolated reaction chamber area of the reaction structure. Test structures are used to measure certain parameters, such as by probing contact pads for each test structure, or such testing may be performed in-situ during processing.

32 Claims, 5 Drawing Sheets

(56) References Cited

U.S. PATENT DOCUMENTS

| | | |
|---|---|---|
| 6,342,733 B1 | 1/2002 | Hu et al. |
| 6,344,084 B1 | 2/2002 | Koinuma et al. |
| 6,364,956 B1 | 4/2002 | Wang et al. |
| 6,420,178 B1 * | 7/2002 | LaGraff et al. .................... 506/5 |
| 6,468,806 B1 | 10/2002 | MacFarland et al. |
| 6,486,055 B1 | 11/2002 | Jung et al. |
| 6,491,759 B1 | 12/2002 | Christen et al. |
| 6,503,834 B1 | 1/2003 | Chen et al. |
| 6,576,906 B1 | 6/2003 | Archibald et al. |
| 6,607,977 B1 | 8/2003 | Rozbicki et al. |
| 6,632,285 B2 | 10/2003 | Wang et al. |
| 6,646,345 B2 | 11/2003 | Sambucetti et al. |
| 6,683,446 B1 | 1/2004 | Pope et al. |
| 6,750,152 B1 | 6/2004 | Christenson et al. |
| 6,756,109 B2 | 6/2004 | Warren et al. |
| 6,758,951 B2 | 7/2004 | Giaquinta et al. |
| 6,818,110 B1 * | 11/2004 | Warren et al. ................... 506/39 |
| 6,821,909 B2 | 11/2004 | Ramanathan et al. |
| 6,821,910 B2 | 11/2004 | Adomaitis et al. |
| 6,825,048 B1 | 11/2004 | Maier et al. |
| 6,828,096 B1 | 12/2004 | Boussie et al. |
| 6,830,663 B2 | 12/2004 | Wang et al. |
| 6,849,462 B1 | 2/2005 | Winkler et al. |
| 6,858,527 B2 | 2/2005 | Gracias |
| 6,872,534 B2 | 3/2005 | Boussie et al. |
| 6,896,783 B2 | 5/2005 | Schunk et al. |
| 6,902,934 B1 | 6/2005 | Bergh et al. |
| 6,905,958 B2 | 6/2005 | Gracias et al. |
| 6,911,129 B1 | 6/2005 | Li |
| 6,919,275 B2 | 7/2005 | Chiang et al. |
| 6,975,032 B2 | 12/2005 | Chen et al. |
| 6,983,233 B1 | 1/2006 | Falcioni et al. |
| 6,996,550 B2 | 2/2006 | Wang et al. |
| 7,008,871 B2 | 3/2006 | Andricacos et al. |
| 7,022,606 B2 | 4/2006 | Mikami et al. |
| 7,052,545 B2 | 5/2006 | Quake et al. |
| 7,077,992 B2 | 7/2006 | Sreenivasan et al. |
| 7,084,060 B1 | 8/2006 | Furukawa et al. |
| 7,136,796 B2 | 11/2006 | Jakatdar et al. |
| 7,280,230 B2 | 10/2007 | Shchegrov et al. |
| 2002/0079487 A1 | 6/2002 | Ramanath et al. |
| 2002/0105081 A1 | 8/2002 | Ramanath et al. |
| 2003/0032198 A1 | 2/2003 | Lugmair et al. |
| 2003/0049862 A1 * | 3/2003 | He et al. ................. 436/180 |
| 2003/0073277 A1 | 4/2003 | Cho et al. |
| 2003/0082587 A1 | 5/2003 | Seul et al. |
| 2003/0141018 A1 | 7/2003 | Stevens et al. |
| 2003/0163295 A1 | 8/2003 | Jakatdar et al. |
| 2003/0186501 A1 | 10/2003 | Rueger |
| 2003/0190408 A1 * | 10/2003 | Moini et al. ................... 427/8 |
| 2003/0224105 A1 | 12/2003 | Chondroudis et al. |
| 2004/0023302 A1 | 2/2004 | Archibald et al. |
| 2004/0070772 A1 | 4/2004 | Shchegrov et al. |
| 2004/0071888 A1 | 4/2004 | Chondroudis et al. |
| 2004/0092032 A1 | 5/2004 | Winkler et al. |
| 2004/0180506 A1 | 9/2004 | Ramanath et al. |
| 2004/0203192 A1 | 10/2004 | Gracias |
| 2004/0245214 A1 | 12/2004 | Katakabe et al. |
| 2004/0253826 A1 | 12/2004 | Ivanov et al. |
| 2005/0011434 A1 | 1/2005 | Couillard et al. |
| 2005/0020058 A1 | 1/2005 | Gracias et al. |
| 2005/0032100 A1 | 2/2005 | Heath et al. |
| 2005/0064251 A1 | 3/2005 | Li et al. |
| 2005/0081785 A1 | 4/2005 | Lubomirsky et al. |
| 2005/0090103 A1 | 4/2005 | Gracias |
| 2005/0091931 A1 | 5/2005 | Gracias |
| 2005/0106762 A1 | 5/2005 | Chakrapani et al. |
| 2005/0263066 A1 | 12/2005 | Lubomirsky et al. |
| 2005/0287573 A1 * | 12/2005 | Stafslien et al. ................. 435/6 |
| 2006/0083664 A1 | 4/2006 | Bahr |
| 2006/0258128 A1 | 11/2006 | Nunan et al. |
| 2007/0029189 A1 | 2/2007 | Zach |
| 2007/0077657 A1 | 4/2007 | Carlson et al. |

FOREIGN PATENT DOCUMENTS

| | | |
|---|---|---|
| WO | WO 03/034484 | 4/2003 |
| WO | WO 03/058671 | 7/2003 |
| WO | WO 2005/035820 | 4/2005 |
| WO | WO 2005/001120 | 6/2005 |

OTHER PUBLICATIONS

Simpson et al., "High Throughput Synthesis and Screening of Chalcenogide Materials for Data Storage," E*PCOS05, pp. 1-9.

Ramberg et al., "Application of High Throughput Methods to the Development of Materials for Non-Magnetic Storage," Mat. Res. Soc. Symp. Proc. vol. 803, 2004, pp. HH2.4.1-HH2.4.6.

F. Tsui et al., "Combinatorial molecular beam epitaxy synthesis and characterization of magnetic alloys," Applied Surface Science, 2002, pp. 333-338.

J. O. Choo et al. "Development of a spatially controllable chemical vapor deposition reactor with combinatorial processing capabilities," Review of Scientific Instruments 76, 2005, p. 062217-1-062217-10.

Frank Tsui et al, "The Combinatorial Approach: A Useful Tool for Studying Epitaxial Processes in Doped Magnetic Semiconductors," Macromolecular Rapid Communications, 2004, pp. 189-195.

Tsui et al., "Combinatorial Synthesis and Characterization of CoMnGe Alloys," Mat. Res. Soc. Symp. Proc., vol. 700, S2.2.1-S2.2.6, 2002.

James S. Cooper et al. "Plasma sputtering system for deposition of thin film combinatorial libraries," Review of Scientific Instruments 76, 2005, pp. 062221-1-062221-7.

Thomas Erichsen et al. "Combinatorial microelectrochemistry: Development and evaluation of an electrochemical robotic system," Review of Scientific Instruments 76, 2005, pp. 062204-1-062204-11.

Glenn Teeter, "Conceptual design of a deposition system for uniform and combinatorial synthesis of multinary thin-film materials via open-boat physical-vapor deposition," J. Vac. Sci. Technol. A 24(4), Jul./Aug. 2006, pp. 1119-1127.

Ramaswamy Sreenivasan et al. "Demonstration of spatially programmable chemical vapor deposition: Model-based uniformity/nonuniformity control," J. Vac Sci Technol. B 24(6), Nov./Dec. 2006, pp. 2706-2715.

Gary W. Rubloff, "In-Situ Metrology: the Path to Real-Tim Advanced Process Control," Int'l Conf. Characterization & Metrology for ULSI Technology, 2003, pp. 1-30.

Semancik et al., "Microhotplate platforms for chemical sensor research," Sensors and Actuators B, 2001, pp. 579-591.

Nano-Master, "NSC-4000 and NSC-3000 Sputter Coaters," http://www.nanomaster.com; main@nanomaster.com.

Nano-Master, Inc., "Combinatorial Sputtering System," http://nanomaster.com.

A. Ludwig et al., "MEMS tools for combinatorial materials processing and high-throughput characterization," Measurement Science and Technology, 2005, pp. 111-118.

Dr. Alfred Ludwig, "Combinatorial Sputter Deposition of Materials Libraries," ludwig@caesar.de.

Qi Wang et al., "High-Throughput Chemical Vapor Deposition System and Thin-Film Silicon Library," Macromolecular Rapid Communications, 2004, pp. 326-329.

Yuji Matsumoto et al., "Combinatorial Laser Molecular Beam Epitaxy (MBE) Growth of Mg—Zn—O Alloy for Band Gap Engineering," Japanese Journal of Applied Physics, Jun. 15, 1999, pp. 603-605.

X.-D Xiang, "Combinatorial Materials Synthesis and Screening: An Integrated Materials Chip Approach to Discovery and Optimization of Functional Materials," Annual Review of Materials Science, 1999, downloaded from arjournals.annualreviews.org, pp. 149-174.

H. Chang et al., A low-loss composition region identified from a thin-film composition spread of $(Ba_{1-x-y}Sr_xCa_y)TiO_3$, Applied Physics Letters, vol. 74, No. 8, Feb. 22, 1999, pp. 1165-1167.

Qi Wang, "Combinatorial hot-wire CVD approach to exploring thin-film Si materials and devices," www.sciencedirect.com, 2003, pp. 78-82.

(56) References Cited

OTHER PUBLICATIONS

Qi Wang, "A combinatorial study of materials in transition from amorphous to microcrystalline silicon," Solid State Communications, 2000, pp. 175-178.

Ryan C. Smith, et al., "Combinatorial Chemical Vapor Deposition of Metal Dioxides Using Anhydrous Metal Nitrates," American Chemical Society, 2002, pp. 474-476.

Ryan C. Smith et al., "Combinatorial Chemical Vapor Deposition. Achieving Compositional Spreads of Titanium, Tin and Hafnium Oxides by Balancing Reactor Fluid Dynamics and Deposition Kinetics," American Chemical Society, 2005, pp. 292-298.

Bin Xia et al., "Balancing reactor fluid dynamics and deposition kinetics to achieve compositional variation in combinatorial chemical vapor depositions," Applied Surface Science, 2004, pp. 14-19.

Qi Wang et al., "Combinatorial synthesis of solid state electronic materials for renewable energy applications," Applied Surface Science, 2002 pp. 271-276.

Jae-Ouk Choo et al., "Simulation-Based Design and Experimental Evaluation of a Spatially Controllable CVD Reactor," AIChE Journal vol. 51, No. 2, Feb. 2005, pp. 572-584.

Ted Sun, "Combinatorial Screening and Optimization of Luminescent Materials and Organic Light Emitting Devices," MRS Bulletin, Apr. 2002, pp. 309-315.

Maier et al., "Combinatorial and High-Throughput Materials Science," Angewandte Chemie, 2007, 46, 6016-6067.

Whiteacre et al., "A Combinatorial Study of $Li_yMn_xNi2_{-x}O_4$ Cathode Materials Using Microfabricated Solid-State Electrochemical Cells," Journal of the Electrochemical Society, 2003, 150 (12) A1676-A1683.

Ohuchi et al., "Materials World Network: Phase change materials for nanoelectrics: A combinatorial approach to mechanistic understanding," 2006.

Koinuma and Takeuchi, "Combinatorial solid-state chemistry of inorganic materials," Jul. 2004, Nature Materials, vol. 3, pp. 429-438.

Nagata et al., "Crystal Structures of Pt—Ru Alloy Schottky Contacts on ZnO by Combinatorial Ion Beam Deposition," Japanese Journal of Applied Physics, vol. 46, No. 5A, 2007, pp. 2907-2909.

FLAMAC, "FLAMAC Flanders Material Centre VZW," Web, http://www.flamac.be/pdf/flam_ac_flyer_jan2006_en.pdf.

FLAMAC, "High Throughput Characterization," Web, http://www.flamc.be/pdf/characterization_en.pdf.

FLAMAC, High-Throughput formulation and coating workflow (Symyx Discovery Tools, US), Web, http://www.flamac.be/pdf/sdt.pdf.

Matsumoto et al., "Combinatorial Investigation of Spintronic Materials," MRS Bulletin, Oct. 2003, pp. 734-739.

Bin Xia et al., "Combinatorial CVD of Zirconium, Hafnium, and Tin Dioxide Mixtures for Applications as High-k Materials," Chemical Vapor Deposition, 2004, pp. 195-200.

S. H. Baeck et al., "Combinatorial Electrochemical Synthesis and Characterization of Tungsten-Based Mixed-Metal Oxides," American Chemical Society, 2002, pp. 563-568.

Sung-Hyeon Baeck et al., "Automated electrochemical synthesis and characterization of $TiO_2$ supported Au nanoparticle electrocatalysts," Measurement Science and Technology, 2005, pp. 54-59.

Vivien K. Cumyn et al., "Design and Testing of a Low-Cost Multichannel Pseudopotentiostat for Quantitative Combinatorial Electrochemical Measurements on Large Electrode Arrays," Electrochemical and Solid-State Letters, 2003, pp. E15-E18.

M. Devenney, et al., "Application of combinatorial methodologies to the synthesis and characterization of electrolytic manganese dioxide," Journal of Applied Electrochemistry, 2004, pp. 643-651.

M.D. Fleischauer et al., "Design and Testing of a 64-Channel Combinatorial Electrochemical Cell," Journal of The Electrochemical Society, 2002, pp. A1465-A1469.

K. Jambunathan et al., "A Multielectrode Electrochemical and Scanning Differential Electrochemical Mass Spectrometry Study of Methanol Oxidation on Electrodeposited $Pt_xRu_y$," American Chemical Society, 2004, pp. 1856-1863.

Rongzhong Jiang et al., "A combinatorial approach toward electrochemical analysis," Journal of Electroanalytical Chemistry, 2002, pp. 137-142.

Renxuan Liu et al., "Array membrane electrode assemblies for high throughput screening of direct methanol fuel cell anode catalysts," Journal of Electroanalytical Chemistry, 2002, pp. 49-55.

Tung Siu et al., "Parallel Electrosynthesis of 1,2-Diamines," American Chemical Society, 2001, pp. 554-558.

Melani G. Sullivan et al., "Automated Electrochemical Analysis with Combinatorial Electrode Arrays," Analytical Chemistry, 1999, pp. 4369-4375.

R.B. van Dover et al., "Discovery of a useful thin-film dielectric using a composition-spread approach," Nature vol. 392, Mar. 1998, pp. 162-164.

Robert W. Cahn, "Rapid alloy assessment," Nature, vol. 410, Apr. 5, 2001 pp. 643-644.

Ichiro Takeuchi et al., "Combinatorial Synthesis and Evaluation of Functional Inorganic Material Using Thin-Film Techniques," MRS Bulletin, Apr. 2002, pp. 301-308.

Saraswat, "Cu Interconnect slides" Stanford University, pp. 1-19.

Jon Reid, "Electromechanical Requirements for Damascene Cu Electroplating," Novellus Systems, pp. 1-49.

Nicolai Petrov, "Process control and material properties of thin electroless Co-based capping layers for copper interconnects," Proc. of SPIE vol. 6002, pp. 1-13.

FLAMAC, "High Throughput Chemical Vapour Deposition Platform", Web, http://flamac.be/pdf/cvd_ilika_en.pdf.

FLAMAC, "Modular platform for high-throughput formulation of highly viscous fluids and powders", Web, http://www.flamac.be/pdf/vf_hte_en.pdf.

FLAMAC, High-throughput formulation, application and screening of high viscous solutions/dispersions/pastes (SDP), Web, http://www.flamac.be/pdf/sdp_introduction.pdf.

* cited by examiner

SYSTEM AND METHOD FOR INCREASING PRODUCTIVITY OF COMBINATORIAL SCREENING

CROSS-REFERENCE TO RELATED APPLICATIONS

This application relates to U.S. patent application Ser. No. 11/132,841, filed May 18, 2005 and issued as U.S. Pat. No. 7,749,881; Ser. No. 11/132,817, filed May 18, 2005 and issued as U.S. Pat. No. 7,390,739; Ser. No. 11/231,047, filed Sep. 19, 2005 with priority to Sep. 17, 2004; Ser. No. 11/284,572, filed Nov. 22, 2005 with priority to Nov. 22, 2004 and issued as U.S. Pat. No. 7,309,658; Ser. No. 11/352,077, filed Feb. 10, 2006 with priority date Oct. 11, 2005 and issued as U.S. Pat. No. 8,084,400; Ser. No. 11/352,016, filed Feb. 10, 2006 with priority date Oct. 11, 2005 and issued as U.S. Pat. No. 7,544,574; Ser. No. 11/352,083, filed Feb. 10, 2006 with priority date Oct. 11, 2005 and issued as U.S. Pat. No. 7,902,063; Ser. No. 11/351,978, filed Feb. 10, 2006 with priority date Oct. 11, 2005; and Ser. No. 11/448,369, filed Aug. 30, 2007 with priority date Feb. 24, 2006 and issued as U.S. Pat. No. 7,955,436.

Each publication, patent, and patent application mentioned in this specification is herein incorporated by reference in its entirety to the same extent as if each individual publication, patent and/or patent application was specifically and individually indicated to be incorporated by reference.

FIELD OF THE INVENTION

The present invention relates to systems, methods, and substrates for simultaneous, parallel and/or rapid serial screening including but not limited to synthesis of materials, deposition of materials, processing, process sequencing, process integration, device integration, characterization, analysis, and testing of more than two compounds, compositions, mixtures, processes, synthesis conditions, or the structures derived from such materials and/or processes at desired locations on a single substrate surface. In particular, the present invention relates to increasing the productivity and effectiveness of combinatorial screening through novel test substrates and techniques.

BACKGROUND

The manufacture of integrated circuits (IC), semiconductor devices, flat panel displays, optoelectronics devices, data storage devices, magnetoelectronic devices, magnetooptic devices, packaged devices, and the like entails the integration and sequencing of many unit processing steps. As an example, IC manufacturing typically includes a series of processing steps such as cleaning, surface preparation, deposition, lithography, patterning, etching, planarization, implantation, thermal annealing, and other related unit processing steps. The precise sequencing and integration of the unit processing steps enables the formation of functional devices meeting desired performance metrics such as speed, power consumption, yield and reliability.

In addition to the increasingly challenging process sequence integration requirements, the tools and equipment employed in device manufacturing have been developed to enable the processing of ever increasing substrate sizes such as the move from 4 inch to 6 inch, to 8 inch (or 200 mm), and now to 12 inch (or 300 mm) diameter wafers in order to fit more ICs per substrate per unit processing step for productivity and cost benefits. Other methods of increasing productivity and decreasing manufacturing costs have been to use batch reactors whereby multiple monolithic substrates can be processed in parallel. A common theme has been to process the entire monolithic substrate or batch substrates uniformly, in the same fashion with the same resulting physical, chemical, electrical, and the like properties across the monolithic substrate.

The ability to process uniformly across an entire monolithic substrate and/or across a series of monolithic substrates is advantageous for manufacturing cost effectiveness, repeatability and control when a desired process sequence flow for IC manufacturing has been qualified to provide devices meeting desired yield and performance specifications. However, processing the entire substrate can be disadvantageous when optimizing, qualifying, or investigating new materials, new processes, and/or new process sequence integration schemes, since the entire substrate is nominally made the same using the same material(s), process(es), and process sequence integration scheme. Conventional full-wafer uniform processing results in fewer data per substrate, longer times to accumulate a wide variety of data and higher costs associated with obtaining such data.

As part of the discovery, optimization, and qualification process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

In addition, there is a need to be able to perform the aforementioned "combinatorial process sequence integration" testing which maximizes the use of the real estate allowed per single monolithic substrate while minimizing the amount of complexity associated with any equipment needed to perform such testing.

SUMMARY

The present invention is used in conjunction with a reactor array with isolated reaction areas for performing parallel and/or serial processing in the various reaction areas to synthesize, modify, and/or form materials within the reaction areas. Many different types of materials using a variety of processing techniques may be formed or be affected on a single substrate. The present invention relates to a technique to efficiently evaluate the material(s) formed or affected on the substrate.

Described herein is a novel substrate for use in rapidly evaluating the structural, physical, optical, chemical, magnetic, and/or electrical differences between materials in discrete regions formed and/or modified across the substrate using parallel or rapid serial processing techniques. Other properties may also be evaluated.

In contrast to the prior art, where the starting substrate is essentially bare, the present invention forms test structures, such as test circuits, on the starting substrate, coupled to the reactor array, wherein each isolated region on the substrate incorporates the aforementioned test structures or test circuits. The test structures form essentially part or all of a bottom surface of each of the isolated areas over which the parallel or rapid serial processing is accomplished. The test structures may or may not be completely formed prior to the parallel or rapid serial processing steps.

Any type of material over the respective test structures, as a product of the parallel or rapid serial processing using the reactor array, is then tested using the test structures. The material formed need not be a solid. A material need not be formed in a reaction area but may be modified by the reaction or otherwise processed.

The test structures may by designed to test for any property of the result of the process performed over at least a portion of the test structure. Simple examples of test structures include 1) separated conductors in a reaction area connected to metal probe pads to test the resistance or capacitance of the synthesized material formed in the area; 2) a conductive bottom plate with probe pads for measuring the resistance or capacitance between the top and bottom of the material; 3) a structure that electrically measures expansion of the material when heated; 4) a seed layer in various shapes to test the ability of the synthesized or processed material to form over the seed layer; 4) a circuit that generates heat or measures a heat related characteristic; 5) holes and trenches in a dielectric layer to determine deposited metal coverage; 6) or other structures for testing other properties. The test structures are not limited to electrical testing.

The test structures in each isolated area of the substrate may be all the same or different, or a combination thereof.

The processes conducted on the substrate may include, but are not limited to, materials deposition or synthesis including pure metals, alloys, ceramics, organic materials, dielectrics, semiconductors, or a combination thereof. The process may also be a clean, etch, or other process performed on an existing material in the reaction area. Other processes are also envisioned.

In one embodiment, one or more sealing surfaces are formed on the substrate around each isolated area, including for example predefined sealing surfaces which may be raised or indented to facilitate sealing of the reactor array to the substrate. Such sealing isolates each test structure from processes performed in other isolated areas during the parallel or rapid serial synthesis or processing of materials.

The test structures may be formed using the same reactor array that will be used to form and/or modify materials during the parallel and/or rapid serial processing or may be formed in any other manner.

In the area of the substrate outside of the test structures and seals, one or more baseline test structures may be formed prior to or during processing to determine, after the parallel or rapid serial synthesis or processing of the materials, the difference between a test structure not subject to any processes and a test structure subject to the processes.

As the required tests become complex, larger test structures can be used. In such a case, fewer synthesized materials can be formed over the substrate. It is also the case that the area of the test structures will be varied according to the screening phase of the process. For example, in the early stages of screening, materials compatibility will be of primary concern. In this case, the individual test areas can be smaller. In later stages of screening, both structural (e.g., the impact of the process on binary or greater systems of materials) and electrical (e.g., the impact of the process on the electrical behavior of a test device) screening become important. In these phases of screening, the required test area will increase in order to give statistical significance to the testing. In addition to varying the area of the test structures, it is desirable to replicate tests from earlier phases of screening within the group of structures used for later phase screening. This provides the ability to correlate results from screening phase to screening phase.

DETAILED DESCRIPTION

Figure 1:
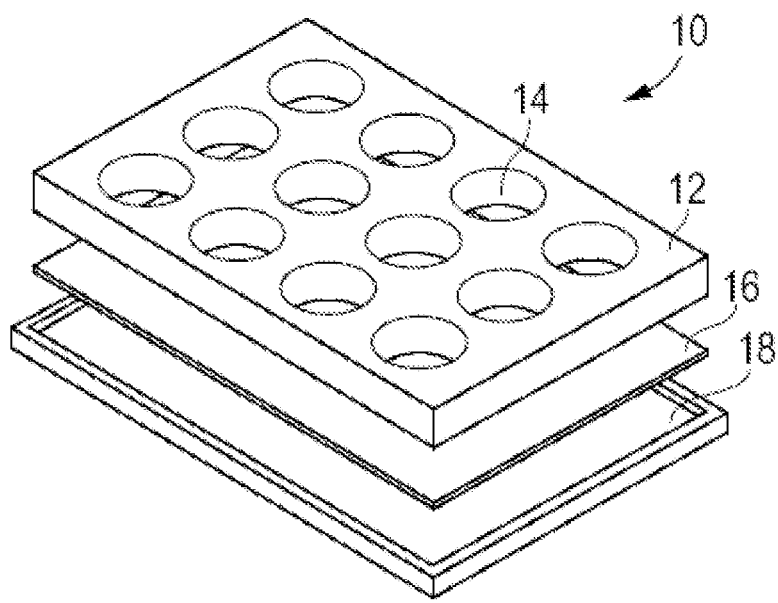
FIG. 1 is an exploded view of an example of a reaction system for parallel synthesis or processing of materials, employing a 4×3 reactor array, a substrate having test circuits formed thereon in accordance with the present invention, and a support tray for securing the reactor array over the substrate.

FIG. 1 illustrates an exploded view of a reactor 10 for parallel and/or rapid serial synthesis or processing of materials. The reactor 10 may also be used for other than developing materials. For example, the reactor 10 may be used for etching or cleaning a material, or for performing another process over the test structure, and the result of the process is characterized using the test structures. The reactor 10 is formed of a reactor array 12, a substrate 16, and a support tray 18.

The reactor array 12 may simply be an aluminum block with openings 14 formed completely through the block. Each opening 14 defines the walls of a discrete reaction chamber. A sleeve is typically inserted into each opening 14 to prevent the formation of materials on the walls of the openings 14. The sleeve is preferably chosen of a material which is chemically inert to the processing environment (e.g., temperature, pH, chemistries employed, etc.). Such materials may include Teflon, PEEK, AlN, $Al_2O_3$, etc., but is not so limited. Process solids, liquids, gasses, charged particles, radiation, and any other process substance(s) for processing materials are delivered into each opening 14 to effect a desired process(es) on the substrate 16 defined by each opening 14. The devices that deliver the process substance(s) into the openings 14 may be sealed with respect to the openings 14 so as not to affect other areas on the substrate 16. In addition, the sealing can enable and/or facilitate the processing of environmentally sensitive (e.g., oxygen sensitive, water sensitive, particle sensitive, pressure sensitive, etc.) materials. The materials processed may be pure metals, conductors, alloys, dielectrics, insulators, semiconductors, ceramics, organic materials, inorganic materials, magnetic materials, magneto-optical materials, phase change materials, photonic materials, optoelectronic materials, piezoelectric materials, liquids, or any other material.

The substrate 16 may be formed of any material, such as a metal, a conductor, a ceramic, a semiconductor, a dielectric, an insulator, quartz, glass, an in-organic surface, an organic surface, and/or any combinations thereof. The substrate 16 may be opaque, semi-transparent, transparent, and/or any combinations thereof. In addition, the substrate 16 may be rigid, semi-rigid, flexible, and/or any combinations thereof. In one embodiment, the substrate 16 is a semiconductor wafer or a portion of a semiconductor wafer chosen to match a reactor geometry, but is not so limited.

The support tray 18 aligns the reactor array 12 and substrate 16 and is used to firmly hold the reactor array 12 and substrate 16 together. Fasteners including, but not limited to, screws or clamps may be used to retain the substrate 16 between the reactor array 12 and tray 18. The tray 18 may have a recess to hold the substrate 16.

The dimensions of the reactor 10 may be on the order of 15 cm×10 cm×5 cm (length×width×height) or any other dimension as appropriate for the substrate. The reactor 10 may be polygonal, circular, or any other shape.

The pitch of the openings 14 may be on the order of a centimeter, or any other dimension. The reactor 10 may have any number of isolated areas ranging from only two to a large number (e.g., hundreds or more) of isolated areas as defined by the openings 14, depending on the size of the single underlying substrate, the size of the isolated areas, and how those isolated areas are defined on the substrate. The geometry of the openings 14 can be circular, polygonal, elliptical, or any other shape. A rectangular 4×3 reactor 10 with circular openings 14 is shown for simplicity.

In one embodiment, the substrate geometry and/or dimensions are chosen to correspond to the reactor 10 geometry and/or dimensions. The substrate may be a portion of a parent substrate. This is beneficial in instances when the parent substrate (e.g., a 200 mm diameter wafer, a 300 mm diameter wafer, a 150 cm×185 cm glass substrate, etc.) i) is substantially larger than the reactor 10 (e.g. a 15 cm×10 cm×5 cm) and/or ii) is not geometrically well correlated to the reactor (e.g. circular parent substrate vs. a rectangular reactor) so as to not effectively utilize the substrate real estate. A 7.25 cm×10.9 cm rectangular portion of a circular wafer is shown in FIG. 1 as one example of substrate 16 geometry.

In another embodiment, the reactor geometry and/or dimensions are chosen to match the substrate geometry and/or dimensions to make more effective use of the parent substrate real estate. In yet another embodiment, both the reactor and substrate geometries and/or dimensions are chosen so as to optimize effective use of the parent substrate real estate.

The dimensions, geometry, periodicity, pitch, spatial layout, and any combinations thereof of the openings 14 in the reactor array 12 can be chosen to optimize and maximize the effective use of the parent substrate real estate. In one embodiment, the dimensions, geometry, periodicity, pitch, spatial layout, and any combinations thereof of the openings 14 are chosen to correlate to the corresponding dimensions, geometry, periodicity, pitch, spatial layout, and any combinations thereof of predefined regions of interest of the substrate 16. In yet another embodiment, the dimensions, geometry, periodicity, pitch, spatial layout, and any combinations thereof of the predefined regions of the substrate 16 are chosen to correlate to the corresponding dimensions, geometry, periodicity, pitch, spatial layout, and any combinations thereof of the openings 14 in the reactor array 12. In yet another embodiment, both the predefined regions of the substrate and the reactor openings 14 are made to have corresponding dimensions, geometry, periodicity, pitch, spatial layout, and any combinations thereof.

Figure 2:
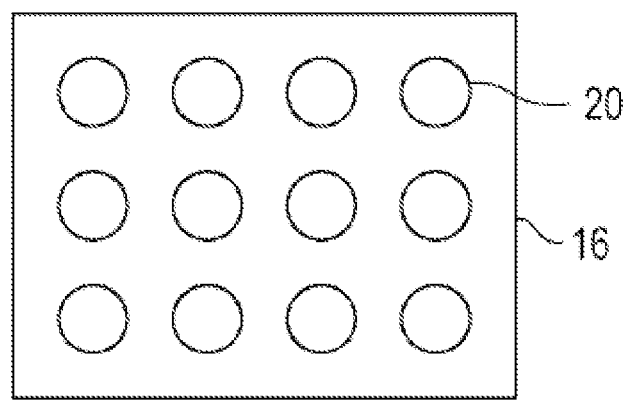
FIG. 2 is a top down view of the substrate in FIG. 1 illustrating the reactor processing areas in which test structures are formed.

FIG. 2 is a top view of the substrate 16 showing the processing areas 20 that correspond to the openings 14 (taking into account any sleeves lining such openings 14). Any materials processed using the reactor 10 will be formed or processed in the isolated processing areas 20. The isolated processing areas 20 allow the processing and testing of: i) more than one material, ii) more than one processing condition, iii) more than one sequence of processing conditions, iv) more than one process sequence integration flow, and combinations thereof, on a single substrate without the need of consuming the equivalent number of substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Prior to the parallel or serial synthesis/processing of the materials, the bare substrate is processed to form test structures in each isolated processing area 20. In one embodiment, the test structures are of a type that will provide an electrical characteristic of the processed material by using probe pins that contact pads outside of the isolated processing areas 20. Non-electrical test structures may also be formed.

The predefined regions of the substrate may contain for example physical test structures, chemical test structures, mechanical test structures, magnetic test structures, optical test structures, electrical test structures, patterned test structures, test devices, functional devices, electrical test elements, active elements, passive elements, integrated circuits, vias, holes, trenches, lines, damascene structures, and/or any combinations thereof.

In another embodiment, processing in the isolated areas 20 may be used to form or finish the formation of test structures that may have been partially formed a priori. Circuits formed outside of the isolated areas 20, but connected to the test circuits inside of the processing areas, may be probed to enable in-situ measurement of material synthesis, modification, and/or processing dynamics in each isolated area, revealing how one or more of the material(s) interact and/or their properties change during synthesis, modification, and/or processing. Such in-situ measurement may be used to measure one or more material properties concurrently including, for example, the concurrent measurement of physical properties such as thickness, and electrical properties such as resistance, during the parallel or rapid serial synthesis or processing of materials in each isolated area.

Figure 3:
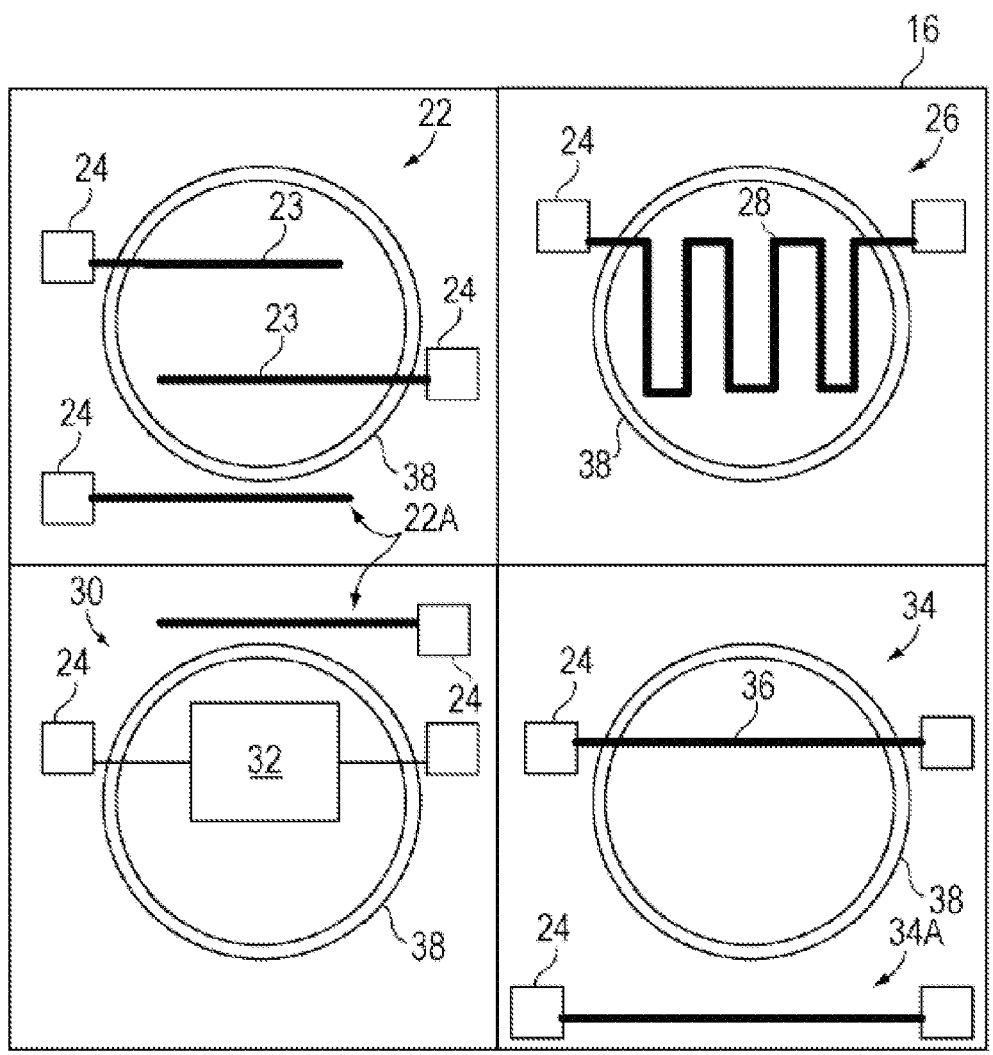
FIG. 3 is a close up of four adjacent processing areas on the substrate with examples of test structures formed in each area and baseline test circuits formed between the processing areas.

FIG. 3 illustrates four adjacent processing areas 20 on the substrate 16 of FIGS. 1 and 2. A different electrical test circuit is formed in each of the four areas 20 as an example. All the areas may have the same test circuit or each circuit may be different.

In the example of FIG. 3, a first test circuit 22 comprises two spaced conductors 23 that electrically contact the subsequently synthesized material. The conductors 23 are insulated from the substrate material by a dielectric if the substrate is formed of a conductor (e.g., a metal sheet). Metal contact pads 24 for probing are electrically connected to the conductors 23 to test the resistance or other parameter of the synthesized material. The conductors 23 may also represent trenches in a dielectric for evaluating the quality of a metal filling the trench. Holes or vias may also be formed. The deposited metal is then in electrical contact with the pads 24.

A second test circuit 26 has a serpentine pattern 28 to test other properties of the synthesized material. Pattern 28 may be a material that changes resistance with stress, and the expansion of the synthesized material may be tested using the test circuit 26. Another embodiment may contain nested comb and/or serpentine line patterns for resistance, capacitance, and/or leakage (e.g., bridging current, line-to-line, etc.) measurements.

A third test circuit 30 may be a metal plate 32 that is used as a bottom electrode for testing the resistance or capacitance of the synthesized material formed over the plate 32.

A fourth test circuit 34, containing a circuit 36, represents another type of test conducted by connecting probe pins to pads 24. The pattern in test circuit 34 may be an optical pattern rather than an electrical circuit. The material synthesized may be an optical material whose properties are tested by the transmission of the optical pattern through the material.

A fifth test circuit could contain test structures that have no probe pads but rather made specifically to be tested with an electron beam or other technique. Any other test structures, electrical or non-electrical, may be formed in areas 20 depending on the testing desired.

In one embodiment of a dual-damascene test structure, the test structure includes holes (or vias) and trenches of various sizes formed in a dielectric layer over the substrate, where a bottom of the holes and trenches has an electrical connection. During a reactor process, a metal is deposited over the test structure, such as a seed layer. The seed layer is then plated during a second portion of the process. After the processing, an electrical measurement is made between the top of the plate layer and the bottom of the holes and trenches, using probe pins, to determine if there is electrical continuity. Since the holes and trenches may be made different sizes in each reaction area, the limits of the seed and plating process may be tested using a single substrate. As seen, the test structure formed on the substrate need only be a portion of a test circuit that is required to perform a test after the reaction process is completed.

In one embodiment, the reactor array 12 in FIG. 1 has a Teflon sleeve in each opening 14. To create a liquid-proof seal around each test circuit in FIG. 3, a region 38 is formed around each test structure that provides more efficient and effective sealing than the unprocessed substrate. The sealing surface must be wide enough to provide sufficient contact area to enable the liquid-tight or gas-tight seal. The region can be composed of a deposited and patterned metal such as aluminum, copper, or other easily deposited materials. The seal material may be formed using evaporation or sputtering followed by etching the unwanted seal material. The seal may also be formed of a patterned resist or polymeric material. In another embodiment, a substantially smooth area is reserved around each test structure to serve as the mating surface to an elastomeric seal formed between the reactor array and the substrate. Elastomeric O-rings (e.g. Viton, Kalrez, Chemrez, etc.) can be inserted in recessed captured grooves in the underside of the reactor array corresponding to each opening of the reactor array and isolated processing area of the substrate.

On the substrate 16, but outside of the sealing walls 38, are formed baseline test structures that are not affected by the processes used to form the synthesized or processed materials. Two baseline circuits 22A and 34A are formed as an example, where the baseline circuits 22A and 34A are identical to test circuits 22 and 34, respectively. When the synthesized, modified, and/or processed materials are tested using the test circuits 22 and 34, the results may be compared to the results from testing the baseline circuit. The test results may then be compensated when evaluating the synthesized or processed material.

The probe pads 24 may be inside the processing areas 20 if not covered up by the synthesized or processed materials.

In one embodiment, the test structures or set of test structures contained in a processing area 20 are identical to that of at least one other processing area 20 of the substrate 16. In another embodiment, all of the processing areas 20 contain identical test structures or sets of test structures. In yet another embodiment, each processing area 20 contains one or more (tens, hundreds, thousand, or more, etc.) test structures. The test structure(s) contained in each such processing area 20 can be identical or of mixed design. The above schemes used in isolation or in combinations can reduce the complexity of the reactor 10, since more types of test structures can be built into each processing area 20, as opposed to building an opening 14 corresponding to each type of test structure. In addition, optimization of the number of instances and/or repeats of test structures within a given processing area 20 and/or across all processing areas 20 of a given substrate 16 enables optimization of the statistical significance and/or confidence of the measured properties of interest during the screening process.

Figure 4:
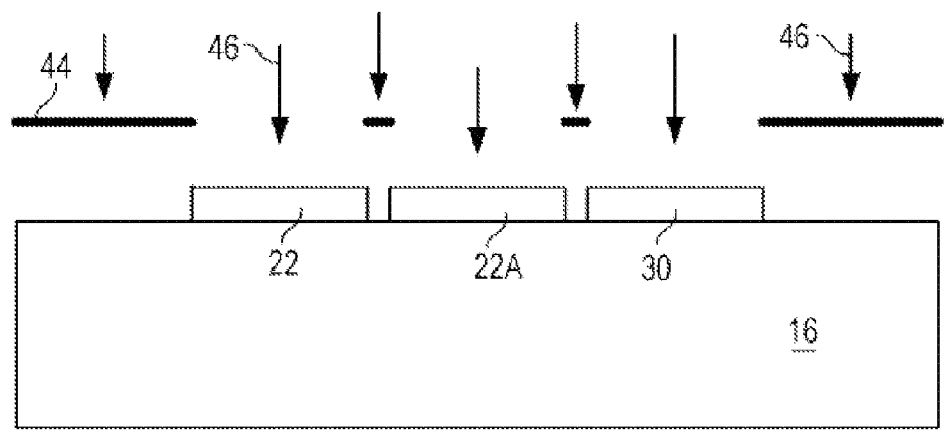
FIG. 4 is a schematic diagram illustrating the fabrication of two test structures in the processing areas and a baseline test structure (the middle structure) outside the processing areas.

FIG. 4 is a side view of the substrate 16 being initially processed to form the test circuits 22 and 30 and baseline circuit 22A. Conventional processing (e.g., surface preparation, cleaning, deposition, lithography, patterning, etching, planarization, implantation, annealing, etc.) may be used to form the test circuits. FIG. 4 illustrates a mask 44 (e.g., patterned silicon dioxide, screen print mask, metallic mask, etc.) for selectively depositing processing material 46 onto the test areas for forming the test circuits and baseline circuits. The processing material(s) may be solids, liquids, gasses, charged particles, radiation, including but not limited to metals, conductors, alloys, dielectrics, insulators, semiconductors, ceramics, organic materials, inorganic materials, magnetic materials, magneto-optical materials, phase change materials, photonic materials, optoelectronic materials, piezoelectric materials, or any other material.

Alternatively, the mask 44 may be the actual reactor array 12 in FIG. 1 that is also subsequently used in the parallel synthesis or processing of materials.

Figure 5:
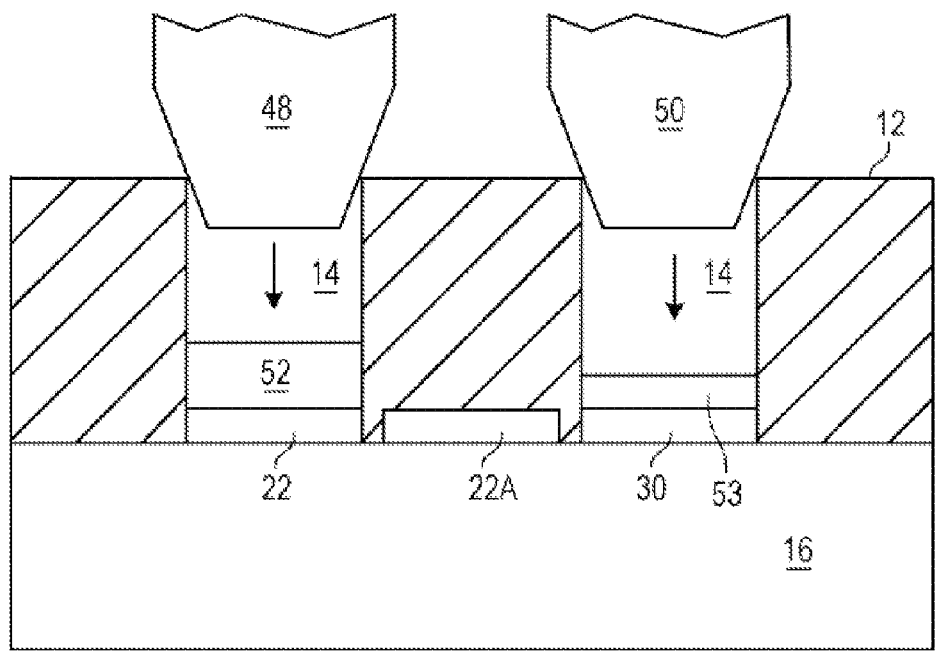
FIG. 5 illustrates the substrate with the test structures undergoing parallel synthesis or processing for forming a variety of materials over the test circuits.

FIG. 5 illustrates the parallel synthesis or processing of materials over the test circuits 22 and 30 using the reactor array 12 from FIG. 1. Nozzles 48 and 50 are shown delivering processing material(s) into the openings 14 for forming the same or different materials 52 and 53 over the test circuits 22 and 30. No material is formed over the baseline circuit 22A. The materials 52 and 53 will later be tested using the test circuits. The nozzles 48 and 52 form a seal with respect to the Teflon sleeve (not shown) protecting the walls of openings 14. Other process steps may be applied equally to all process areas. The processing may also be conducted in series, where a processing step is only applied through one opening 14 of the reactor array 12 at a time. The processing steps may also be performed using a combination of serial and parallel steps.

In another embodiment, the processing over one or more internal test structures establish electrical connection to one or more external test structures.

Using the aforementioned system and methods, the isolated processing areas 20 as shown in FIG. 2 allow the processing and testing of i) more than one material, ii) more than one processing condition, iii) more than one sequence of processing conditions, iv) more than one process sequence integration flow, and combinations thereof, on a single substrate without the need of consuming the equivalent number of substrates per material(s), processing condition(s), sequence(s) of processing conditions, sequence(s) of processes, or any combinations thereof.

During the processing, the process areas may be heated by any known means. In one embodiment, each processing area is heated independently by either a heater in or under the substrate. In another embodiment, a site addressable heating source, including but not limited to a laser source, e-beam source, UV source, IR source, radiative lamp source, heated gases, heated fluids, etc., can be applied prior, during, and/or post processing.

Figure 6:
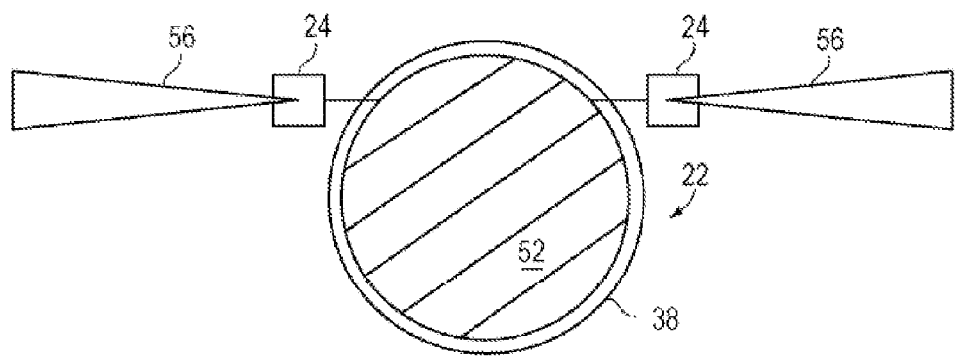
FIG. 6 illustrates the probing of the test structure pads to test properties of the material formed over the test structure.

FIG. 6 illustrates the testing of the material 52 in one process area using probe pins 56 contacting each pad 24. The tests are conducted after removing the reactor array 12 from the substrate 16. In another embodiment, the contact pads for each test area and baseline circuit are located on a periphery of the substrate that is not covered by the reactor array 12. In such a case, the testing may be conducted during the synthesis or processing of the material(s). The testing may take place in parallel or serially by automatic test equipment operating in accordance with a computer program. In another embodiment, the test structures incorporate no probe pads and are instead probed using an electron beam. This embodiment allows higher density packing of the structures of interest and also enables non-contact testing of the resulting test structures which can facilitate inserting the test wafers back into the manufacturing process.

Electrical testing may employ constant current, constant voltage, constant temperature, ramped or alternating current, ramped or alternating voltage, ramped or alternating temperature, and/or combinations thereof. Test structures and/or devices employed can be passive, active, and/or combinations thereof. Data obtained from the test structures can also be used to correlate to data collected during processing e.g. temperature, flows, pressure, materials sequencing, etc. Flow sensors, pressure sensors, temperature sensors, chemical sensors, and/or combinations thereof can be incorporated into the reactor array 12 and/or dispensing device(s).

In addition to a final test after the material(s) has been completely synthesized or processed, the substrate may be removed from the reactor array at various times during the synthesizing or processing of the material(s) to test the material at such different stages. For example, the test may determine the effects of varying the thickness of the material(s). The synthesizing or processing may even be changed based on the results of the intermediate testing.

In a development or screening cycle, typically there are many materials synthesized or processed involving large permutations of a plurality of materials, a plurality of processes, a plurality of processing conditions, a plurality of material application sequences, a plurality of process integration sequences, and combinations thereof. The reactor array opening sizes may be made very small so that many reactor openings 14 may be used in a single reactor. Testing of these many materials may use a simple and small test circuit to test one or more basic parameters for one or more desired properties of each material. Once the successful materials have been selected after testing, the successful processes may be varied to synthesize or process a new set of materials using a different reactor array. Since testing of these second stage materials may be more complex, larger test circuits with more sophisticated test elements may be required, so larger reactor array openings 14 are used. This iterative process may continue with larger and more complex test circuits being used for testing different parameters. This approach serves to increase the productivity of the combinatorial screening process by i) maximizing the effective use of the substrate real estate and ii) optimizing the corresponding reactor and test circuit design with the level of sophistication required to answer the level of questions necessary per stage of screening. Complex reactors and/or test circuit designs are utilized at later stages of screening when desired properties of the materials, processing conditions, process sequences, etc. are substantially known and/or have been refined via prior stages of screening.

Additionally, subsections of test structures from some screening levels may be incorporated into subsequent, more complex, screening levels in order to provide a basis for developing correlations. In other words, by using some of the previous test structures in a subsequent screening level, the developer can see how the results of the subsequent process differed from the results of the previous process. An example of this would be to have materials compatibility structures as the primary test vehicle in primary screening, but carry these test structures forward to secondary and tertiary screening test vehicles in order to give a basis for comparison across all levels. This will aid in identifying the differences between reactors and reaction conditions and should significantly aid in the decision-making process.

Figure 7:
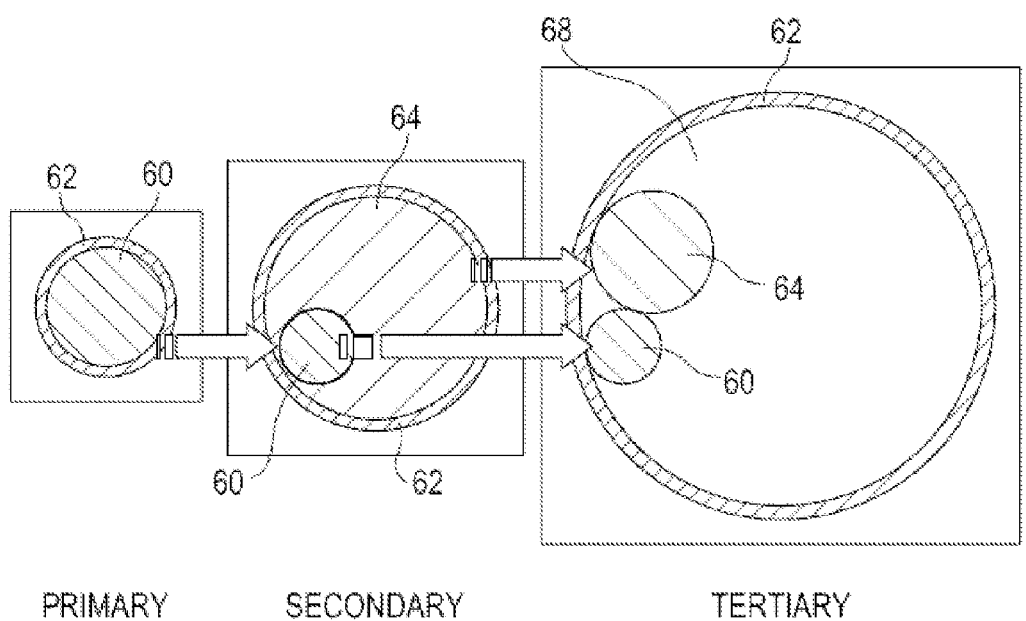
FIG. 7 illustrates how test structures formed on three substrates, for increasingly complex levels of screening, become larger and more complex and may incorporate test structures from lower levels of screening.

FIG. 7 illustrates this idea. In an initial (primary level) test for testing some basic parameters, simple and small test structures 60 are formed on the substrate (only one test structure is shown for simplicity). Each test structure 60 is surrounded by a seal 62, isolating the reaction area from other reaction areas when the reactor array is clamped to the substrate. Many other reaction areas on the same substrate may have an identical test structure 60. After the reaction sequence is completed, the process results are tested using the test structure 60, and the results are screened for the next level of screening. More complex test structures 64 are then used in reaction areas on a second substrate for a secondary level of processing and testing. The test structure 60 from the primary level test is incorporated along with the more complex test structure 64 in one or more reaction areas for the secondary level, so that the results from both test structures 60 and 64 are obtained in the secondary level. The results from the test structure 60 can then be compared to the test results from the primary level. The same technique is applied to a tertiary level, were the testing and screening is even more complex, requiring a more complex and larger test structure 68 and larger reactor areas on a third substrate. The test structures 60 and 64 from the primary and secondary levels are incorporated into the reactor areas to repeat the previous tests.

Figure 8:
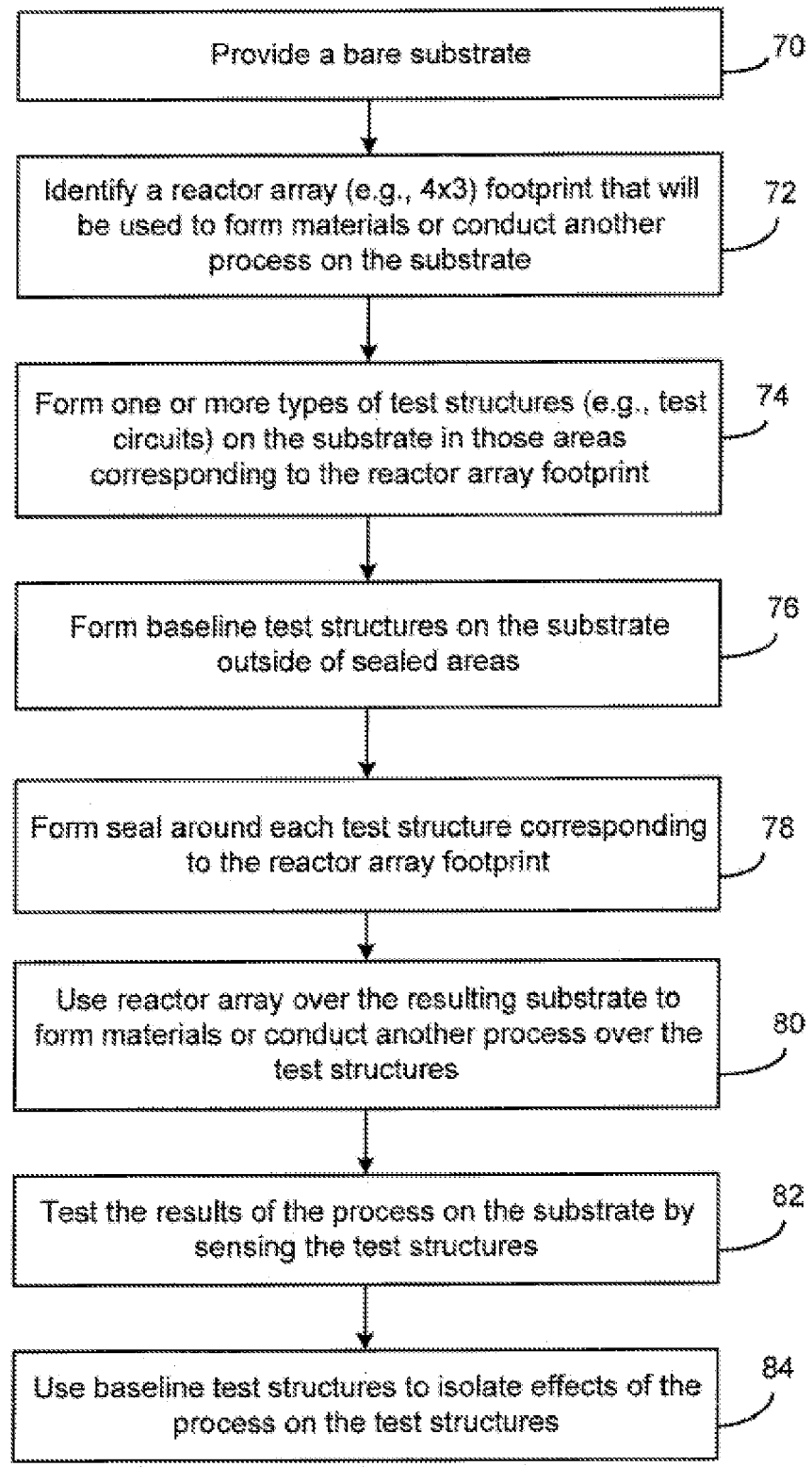
FIG. 8 is a flowchart of the basic steps in one embodiment of the invention.

FIG. 8 is a flowchart of the basic steps used in one embodiment of a process to synthesize, process, and analyze materials.

In step 70 of FIG. 8, a bare substrate is provided suitable for use in synthesizing or processing the materials of interest or for conducting another process on the substrate.

In step 72, the reactor array that will be used for conducting the process is identified. The pattern of processing areas in the reactor array is referred to herein as a "footprint."

In step 74, one or more types of test structures are formed on the substrate in those areas corresponding to the reactor array footprint.

In step 76, baseline test structures are formed on the substrate outside of the reaction areas. Steps 74 and 76 may be performed concurrently.

In step 78, a raised seal is optionally formed around each test structure to isolate the reaction areas from one another. The seals press against ends of Teflon sleeves forming walls of the reaction areas.

In step 80, materials are formed or processed over the test structures (or other processes are performed) using the reactor array identified in step 72.

In step 82, after the processing is complete, or at certain stages of the processing, the test structures are probed or accessed by direct or indirect methods to test the materials or other results of the process. This may occur with or without removal of the substrate from the reactor or any processing system.

In step 84, the testing of the baseline structures can be used to isolate and understand the effects of the materials or process on the test structures.

Steps 82 and 84 may be performed concurrently as appropriate.

Additional details of various embodiments are described below.

Materials which can be processed using the present invention include for example metals, conductors, alloys, metal alloys, dielectrics, insulators, intermetallics, semiconductors, ceramics, organic materials, inorganic materials, magnetic materials, magneto-optical materials, phase change materials, photonic materials, optoelectronic materials, piezoelectric materials, inorganic materials, organic materials, self-assembled monolayers, polymers, non-biological organic polymers, biological materials, composite materials (e.g., inorganic composites, organic composites, or combinations thereof), covalent network solids, ionic solids, molecular solids, or any other materials, etc., and combinations thereof. Once processed, these materials can be screened in parallel or rapid serial manner, using the test structures formed on the substrate, for useful properties including, for example, electrical, thermal, mechanical, morphological, structural, optical, optoelectronic, photoelectric, piezoelectric, magnetic, magneto-optical, chemical, photochemical, molecular or other properties, or any combination of properties, known to and used by those of skill in the art. As such, the present invention provides methods and apparatus for the parallel or rapid-serial synthesis, processing, and analysis of novel materials having new and useful properties. Any material(s) found to possess useful propert(ies) can be subsequently prepared on a larger scale.

Using this method, the effects of the various reaction or processing parameters can be studied on many materials simultaneously and, in turn, such reaction parameters can be optimized. Reaction parameters which can be varied include, for example, reactant amounts, reactant solvents, reaction temperatures, reaction times, the pressures at which the reactions are carried out, the atmospheres in which the reactions are conducted, the rates at which the reactions are quenched, the order in which the reactants are deposited, etc., but are not so limited. Moreover, this method allows the processing and testing of: i) more than one material, ii) more than one processing condition, iii) more than one sequence of processing conditions, iv) more than one process sequence integration flow, and combinations thereof, on a single substrate without the need of consuming the equivalent number of substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

In the delivery systems that can be used with the present invention, a small, precisely metered amount of each reactant component is delivered into each reaction region. This may be accomplished using a variety of delivery techniques, either alone or in combination with a variety of masking techniques. For example, thin-film deposition in combination with physical masking or photolithographic techniques can be used to deliver various reactants to selected regions on the substrate. Reactants can be delivered for example, as amorphous films, epitaxial films, lattice and superlattice structures, solids, liquids, gases, charged particles, radiation, etc. Moreover, using such techniques, reactants can be delivered to each site in a uniform distribution, or in a gradient of stoichiometries and/or compositions. Alternatively, the various reactant components can be deposited into the reaction regions of interest from a dispenser in the form of droplets, powder, and/or continuous flow with suitable exit channel. Suitable dispensers include, for example, micropipettes, mechanisms adapted from ink-jet printing technology, pressurized, vacuum, peristaltic, or electrophoretic pumps.

Once the components of interest have been delivered to predefined regions on the substrate, they can be processed using a number of different reaction routes to form an array of materials. Processing includes physical modifications, chemical modifications, electrical modifications, thermal modifications, magnetic modifications, photonic modifications, and photolytic modifications. More specific examples include cleaning, surface modification, surface preparation, deposition, dispensing, reaction, functionalization, etching, planarization, chemical mechanical planarization, electrochemical mechanical planarization, lithography, patterning, implantation, irradiation, electromagnetic irradiation, microwave irradiation, radio frequency (RF) irradiation, thermal treatment, infrared (IR) treatment, ultraviolet (UV) treatment, deep ultraviolet (DUV) treatment, extreme ultraviolet (EUV) treatment, electron beam treatment, and x-ray treatment, and more specifically electrochemical deposition, electroless deposition, physical vapor deposition, chemical vapor deposition, atomic layer deposition, vapor phase epitaxy, liquid phase epitaxy, chemical beam epitaxy, molecular beam epitaxy, molecular self-assembly, and evaporation.

The components can be reacted using, for example, solution-based synthesis techniques, photochemical techniques, polymerization techniques, template directed synthesis techniques, epitaxial growth techniques, by the sol-gel process, by thermal, infrared or microwave heating, by calcination, sintering or annealing, by hydrothermal methods, by flux methods, by crystallization through vaporization of solvent, etc. as known to and used by those of skill in the art. Thereafter, the array can be screened for materials having useful properties.

While particular embodiments of the present invention have been shown and described, it will be obvious to those skilled in the art that changes and modifications may be made without departing from this invention in its broader aspects and, therefore, the appended claims are to encompass within their scope all changes and modifications that fall within the true spirit and scope of the invention.

What is claimed is:

1. A tool for use in analyzing results of one or more processes comprising:
    a reactor array comprising a pattern of isolated reaction areas for performing a semiconductor process in each reaction area to deposit a substantially uniform layer within each reaction area, wherein the reactor array has openings which have removable sleeves disposed therein;

a semiconductor substrate aligned with the reactor array, the semiconductor substrate forming a surface of the plurality of the reaction areas, a plurality of test structures being fabricated on the semiconductor substrate, at least some of the test structures having a location corresponding to a reaction area of the reactor array;

each test structure comprising a structure that facilitates testing of the results of the semiconductor process performed in a reaction area; and a plurality of process devices for performing the semiconductor processes in the reaction areas, each of the process devices forming a seal with a top surface of the removable sleeve, wherein a bottom surface of the removable sleeve seals with a top surface of the semiconductor substrate, the removable sleeve removably coupled to the top surface of the semiconductor substrate and a surface of the reactor array, wherein the reactor array is operable to form multiple layers of different material in different isolated reaction areas without changing orientation of the reactor array;

wherein a support tray aligns the reactor array and the semiconductor substrate;

wherein the reactor array is affixed to the semiconductor substrate by the support tray after alignment of the semiconductor substrate to the reactor array.

2. The tool of claim 1 wherein each test structure comprises an electrical contact area for being contacted by a testing device to test at least one parameter of the results of the process performed over the test structure.

3. The tool of claim 1 further comprising seal structures formed on the semiconductor substrate for making a seal with the removable sleeves around each reaction area to isolate each reaction area from processes performed in other reaction areas.

4. The tool of claim 3 wherein the seal structures comprise raised portions on the semiconductor substrate around each reaction area.

5. The tool of claim 1 wherein the test structures in the reaction areas are identical.

6. The tool of claim 1 wherein the test structures in the reaction areas are different from one another.

7. The tool of claim 1 wherein at least some of the test structures in the reaction areas test for electrical properties of a material processed over the test structures.

8. The tool of claim 1 wherein at least some of the test structures in the reaction areas test for non-electrical properties of a material processed over the test structure.

9. The tool of claim 1 wherein at least some of the test structures comprise physical test structures, chemical test structures, mechanical test structures, magnetic test structures, optical test structures, or electrical test structures.

10. The tool of claim 1 wherein at least some of the test structures comprise vias, holes, trenches, or lines.

11. The tool of claim 1 wherein at least some of the test structures comprise probe pads formed on the semiconductor substrate.

12. The tool of claim 1 wherein a material is deposited over a test structure.

13. The tool of claim 1 wherein a material is formed over a test structure by a combination of process steps.

14. The tool of claim 1 wherein a material over a test structure is etched.

15. The tool of claim 1 wherein a material over a test structure is cleaned.

16. The tool of claim 1 wherein the reactor array and the semiconductor substrate have opposing surfaces that are approximately the same size.

17. The tool of claim 1 where the pattern of isolated reaction areas comprises a plurality of openings in a reactor structure.

18. The tool of claim 1 further comprising forming at least one type of material in the reaction areas over the test structures, the material being formed in the reaction areas.

19. The tool of claim 1 wherein at least one type of material resulting from the process is in direct contact with at least a portion of an underlying test structure.

20. The tool of claim 1 further comprising a plurality of materials combinatorially formed in different reaction areas over the test structures, the plurality of materials being formed in the reaction areas.

21. The tool of claim 1 wherein the semiconductor process performed in each reaction area comprises at least one of physical modifications, chemical modifications, electrical modifications, thermal modifications, magnetic modifications, photonic modifications, and photolytic modifications; wherein the at least one of physical modifications, chemical modifications, electrical modifications, thermal modifications, magnetic modifications, photonic modifications, and photolytic modifications include at least one of cleaning, surface modification, surface preparation, deposition, etching, planarization, chemical mechanical planarization, electrochemical mechanical planarization, lithography, patterning, implantation, irradiation, electromagnetic irradiation, microwave irradiation, radio frequency (RF) irradiation, thermal treatment, infrared (IR) treatment, ultraviolet (UV) treatment, deep ultraviolet (DUV) treatment, extreme ultraviolet (EUV) treatment, electron beam treatment, and x-ray treatment.

22. The tool of claim 21 wherein at least one of the physical modifications, chemical modifications, electrical modifications, thermal modifications, magnetic modifications, photonic modifications, and photolytic modifications is used to form a material in at least one of the reaction areas.

23. The tool of claim 1 wherein the test structures are formed on the semiconductor substrate prior to conducting processes within a reaction area.

24. The tool of claim 1 wherein at least a portion of the test structures are formed during conducting processes within a reaction area.

25. The tool of claim 1 wherein the semiconductor substrate comprises at least a first reaction area and a second reaction area, the first reaction area including at least one area modified using a first combinatorial processing that includes at least one of a plurality of materials, a plurality of processes, a plurality of processing conditions, a plurality of material application sequences, and a plurality of process sequences, the second reaction area including at least one area modified using a second combinatorial processing that includes at least one of a plurality of materials, a plurality of processes, a plurality of processing conditions, a plurality of material application sequences, and a plurality of process sequences, wherein at least one of the materials, processes, processing conditions, material application sequences, and process sequences is different between the first combinatorial processing and the second combinatorial processing.

26. The tool of claim 1 wherein each of the process devices comprises a nozzle for delivering processing materials into one of the reaction areas, wherein the nozzle forms the seal with the top of the removable sleeve.

27. The tool of claim 2 wherein testing is performed during performance of the semiconductor process in at least one of the reaction areas.

28. The tool of claim 1 further comprising baseline test structures in areas of the semiconductor substrate outside of the reaction areas that are unaffected by semiconductor processing within the reaction areas.

29. The tool of claim 1, wherein the plurality of process devices are semiconductor fabricated devices.

30. The tool of claim 1, wherein the semiconductor substrate on which the plurality of test structures are fabricated on changes as a result of the semiconductor processing.

31. The tool of claim 1, wherein the substrate is a semiconductor wafer.

32. The tool of claim 1, wherein the removable sleeve prevents the formation of materials on the openings.

* * * * *